US012087377B2

(12) United States Patent
Cao et al.

(10) Patent No.: US 12,087,377 B2
(45) Date of Patent: Sep. 10, 2024

(54) ANTI-FUSE PROGRAMMING CONTROL CIRCUIT BASED ON MASTER-SLAVE CHARGE PUMP STRUCTURE

(71) Applicant: WUXI ESIONTECH CO., LTD., Wuxi (CN)

(72) Inventors: Zhengzhou Cao, Wuxi (CN); Yueer Shan, Wuxi (CN); Yanfei Zhang, Wuxi (CN); Yan Jiang, Wuxi (CN); Yuting Xu, Wuxi (CN); Hui Xu, Wuxi (CN)

(73) Assignee: WUXI ESIONTECH CO., LTD., Wuxi (CN)

( * ) Notice: Subject to any disclaimer, the term of this patent is extended or adjusted under 35 U.S.C. 154(b) by 176 days.

(21) Appl. No.: 17/903,061

(22) Filed: Sep. 6, 2022

(65) Prior Publication Data

US 2022/0415422 A1 Dec. 29, 2022

Related U.S. Application Data

(63) Continuation of application No. PCT/CN2022/102657, filed on Jun. 30, 2022.

(30) Foreign Application Priority Data

Dec. 22, 2021 (CN) .......................... 202111582298.8

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
See application file for complete search history.

(56) References Cited

U.S. PATENT DOCUMENTS

| 6,690,227 B2 * | 2/2004 | Lee ....................... | H02M 3/073 327/536 |
| 7,391,873 B2 * | 6/2008 | Deruginsky .......... | H02M 3/073 381/115 |

(Continued)

FOREIGN PATENT DOCUMENTS

| CN | 104409100 A | 3/2015 |
| CN | 108511024 A | 9/2018 |

(Continued)

*Primary Examiner* — Vanthu T Nguyen
(74) *Attorney, Agent, or Firm* — Bayramoglu Law Offices LLC (57) ABSTRACT

In an anti-fuse programming control circuit based on a master-slave charge pump structure, a master charge pump module obtains an external voltage and is connected to a plurality of slave charge pump modules. Each slave charge pump module is connected to an anti-fuse bank. The distance between the layout position of each slave charge pump module and the layout position of the connected anti-fuse bank does not exceed a predetermined distance. Based on a programming voltage output by each slave charge pump module to the connected anti-fuse bank, the feedback network outputs a feedback signal corresponding to the slave charge pump module to the master charge pump module. Based on the feedback signal corresponding to each slave charge pump module, the master charge pump module adjusts a master drive signal provided to the slave charge pump module to stabilize the programming voltage output by the slave charge pump module.

9 Claims, 4 Drawing Sheets

(56) References Cited

U.S. PATENT DOCUMENTS

| | | | | |
|---|---|---|---|---|
| 7,885,091 B2 * | 2/2011 | Mihnea | ................... | G11C 8/12 |
| | | | | 365/148 |
| 8,013,666 B1 * | 9/2011 | Liu | ....................... | H02M 3/07 |
| | | | | 363/60 |

FOREIGN PATENT DOCUMENTS

| CN | 111310394 A | 6/2020 |
|---|---|---|
| CN | 114300022 A | 4/2022 |
| WO | 2013067474 A1 | 5/2013 |

* cited by examiner

ANTI-FUSE PROGRAMMING CONTROL CIRCUIT BASED ON MASTER-SLAVE CHARGE PUMP STRUCTURE

CROSS REFERENCE TO THE RELATED APPLICATIONS

This application is the continuation application of International Application No. PCT/CN2022/102657, filed on Jun. 30, 2022, which is based upon and claims priority to Chinese Patent Application No. 202111582298.8, filed on Dec. 22, 2021, the entire contents of which are incorporated herein by reference.

TECHNICAL FIELD

The present disclosure relates to the technical field of anti-fuses, in particular, to an anti-fuse programming control circuit based on a master-slave charge pump structure.

BACKGROUND

A metal-to-metal (MTM) anti-fuse memory device performs programming by using a puncturable medium between two layers of metal to store data. The MTM anti-fuse memory device has natural anti-radiation performance, high reliability, and high integration. However, the performance of the MTM anti-fuse memory device depends on the consistency of the resistance value after anti-fuse programming, and the consistency of the resistance value after anti-fuse programming is highly dependent on high programming voltage. At present, the conventional practice is to provide high programming voltage by a charge pump, which affects accuracy and performance.

SUMMARY

Technical Problem

The performance of an MTM anti-fuse memory device depends on the consistency of the resistance value after anti-fuse programming, and the consistency of the resistance value after anti-fuse programming is highly dependent on high programming voltage. At present, the conventional practice is to provide the programming-specific high voltage by a charge pump, which affects accuracy and performance.

SOLUTIONS TO THE PROBLEMS

Technical Solutions

To resolve the above problems and meet the above technical requirements, the present disclosure provides an anti-fuse programming control circuit based on a master-slave charge pump structure. The technical solutions of the present disclosure are as follows:

An anti-fuse programming control circuit based on a master-slave charge pump structure includes a master charge pump module, a plurality of slave charge pump modules, and a feedback network. The master charge pump module obtains an external voltage and is connected to the slave charge pump modules. Each of the slave charge pump modules is connected to an anti-fuse bank. The distance between the layout position of each of the slave charge pump modules and the layout position of the connected anti-fuse bank does not exceed a predetermined distance.

Based on a programming voltage output by each of the slave charge pump modules to the connected anti-fuse bank, the feedback network outputs a feedback signal corresponding to the slave charge pump module to the master charge pump module. Based on the feedback signal corresponding to each of the slave charge pump modules, the master charge pump module adjusts a master drive signal provided to the slave charge pump module to stabilize the programming voltage output by the slave charge pump module.

As a further technical solution, the master charge pump module includes four parallel master charge pumps that work simultaneously. The phase difference between the working clocks of the master charge pumps is 90°. By using the four master charge pumps, the master charge pump module provides the master drive signal of a current value required for anti-fuse programming.

As a further technical solution, each of the master charge pumps includes a first voltage conversion module, a second voltage conversion module, a third voltage conversion module, and a fourth voltage conversion module that are cascaded in sequence. An input terminal of the first voltage conversion module is connected to an input terminal of the master charge pump to obtain the external voltage. An output terminal of the fourth voltage conversion module is connected to an output terminal of the master charge pump to output the master drive signal.

Each voltage conversion module includes negative channel metal oxide semiconductor (NMOS) transistors N0, N4, N8, N9, N16, and N17. A drain of N8, a drain of N9, and a drain of N4 are connected and used as the input terminal of the voltage conversion module. A gate of N8, a source of N9, a gate of N17, and a gate of N4 are connected. A gate of N9, a source of N8, and a gate of N16 are connected. A source of N4 and a gate of N0 are connected and used as the output terminal of the voltage conversion module. A drain and a source of N0 are connected and used as a first clock terminal of the voltage conversion module. A drain and a source of N16 are connected and used as a second clock terminal of the voltage conversion module. A drain and a source of N17 are connected and used as a third clock terminal of the voltage conversion module.

The clock terminals of the voltage conversion modules are respectively controlled by clock signals determined by the working clocks of the master charge pumps.

As a further technical solution, each of the master charge pumps works in a first working mode or a second working mode based on the received mode control signal.

When the master charge pump works in the first working mode, the master charge pump obtains a first external voltage, two adjacent voltage conversion modules are in different working states for voltage conversion and output, and the master drive signal output by the master charge pump module when the internal master charge pump works in the first working mode supports bit-based anti-fuse programming.

When the master charge pump works in the second working mode, all the voltage conversion modules are in the same working state, the master charge pump directly and transparently transmits and outputs an obtained second external voltage, and the master drive signal output by the master charge pump module when the internal master charge pump works in the second working mode supports byte-based anti-fuse programming. The second external voltage is greater than the first external voltage.

As a further technical solution, when the master charge pump works in the first working mode, in the master charge pump:

Both the first clock terminal of the first voltage conversion module and the first clock terminal of the third voltage conversion module are connected to the working clock CLK0 of the master charge pump. Both the second clock terminal of the first voltage conversion module and the second clock terminal of the third voltage conversion module are connected to the working clock CLK0 of the master charge pump. Both the third clock terminal of the first voltage conversion module and the third clock terminal of the third voltage conversion module are connected to a first clock signal CLK1 of the master charge pump.

Both the first clock terminal of the second voltage conversion module and the first clock terminal of the fourth voltage conversion module are connected to a second clock signal CLK2 of the master charge pump. Both the second clock terminal of the second voltage conversion module and the second clock terminal of the fourth voltage conversion module are connected to the second clock signal CLK2 of the master charge pump. Both the third clock terminal of the second voltage conversion module and the third clock terminal of the fourth voltage conversion module are connected to a third clock signal CLK3 of the master charge pump.

The first clock signal CLK1 and the working clock CLK0 are a pair of overlapping clocks, the second clock signal CLK2 and the third clock signal CLK3 are a pair of overlapping clocks, and the second clock signal CLK2 and the working clock CLK0 are a pair of inverse clocks.

As a further technical solution, the second clock signal CLK2 and the working clock CLK0 are a pair of non-overlapping inverse clocks, and both CLK0 and CLK2 are simultaneously at a high level in a predetermined duration at rising and falling edges.

As a further technical solution, the master charge pump further includes OR gates I0 and I1 and dual-input selectors I2 and I3. One input terminal of I0 is connected to the mode control signal UTR. The other input terminal of I0 is connected to the second clock signal CLK2. An output terminal of I0 is connected to the first clock terminal of the second voltage conversion module and the first clock terminal of the fourth voltage conversion module. One input terminal of I1 is connected to the mode control signal UTR, and the other input terminal of I1 is connected to the working clock CLK0. An output terminal of I1 is connected to the first clock terminal of the first voltage conversion module and the first clock terminal of the third voltage conversion module.

The second clock terminal of the first voltage conversion module and the second clock terminal of the third voltage conversion module are connected to the working clock CLK0, and the third clock terminal of the first voltage conversion module and the third clock terminal of the third voltage conversion module are connected to the first clock signal CLK1.

A first input terminal of I2 is connected to the second clock signal CLK2. A second input terminal of I2 is connected to the working clock CLK0. An output terminal of I2 is connected to the second clock terminal of the second voltage conversion module and the second clock terminal of the fourth voltage conversion module, and a selection input terminal of I2 is connected to the mode control signal UTR.

A first input terminal of I3 is connected to the third clock signal CLK3. A second input terminal of I3 is connected to the first clock signal CLK1. An output terminal of I3 is connected to the third clock terminal of the second voltage conversion module and the third clock terminal of the fourth voltage conversion module, and a selection input terminal of I3 is connected to the mode control signal UTR.

When the mode control signal UTR is 0, I2 outputs the second clock signal CLK2, I3 outputs the third clock signal CLK3, and the master charge pump enters the first working mode.

When the mode control signal UTR is 1, I2 outputs the working clock CLK0, I3 outputs the first clock signal CLK1, and the master charge pump enters the second working mode.

As a further technical solution, the feedback network includes a feedback voltage selection module, a comparator, and voltage dividing modules respectively connected at output terminals of the slave charge pump modules. Each of the voltage dividing modules outputs a voltage dividing signal of a programming voltage of one connected slave charge pump module. The feedback voltage selection module includes a plurality of input terminals and an output terminal. The input terminals of the feedback voltage selection module are respectively connected to the voltage dividing modules to obtain voltage dividing signals. The output terminal of the feedback voltage selection module is connected to an inverting input terminal of the comparator, and a noninverting input terminal of the comparator is connected to a reference voltage.

The feedback voltage selection module selects and outputs a voltage dividing signal of a programming voltage of one slave charge pump module to the comparator. An output terminal of the comparator outputs a feedback signal of one selected slave charge pump module to the master charge pump module as an enable signal of the master charge pump module, and the master charge pump module is enabled at a high level.

As a further technical solution, the feedback voltage selection module includes a plurality of selection switch transistors. Each of the selection switch transistors is connected between one voltage dividing module and the output terminal of the feedback voltage selection module. The selection switch transistor is controlled by a selection signal of the anti-fuse bank connected to the slave charge pump module connected to the voltage dividing module.

As a further technical solution, an input terminal of each of the slave charge pump modules is connected to an output terminal of the master charge pump module and obtains the master drive signal HV_M output by the master charge pump module. A drain of an NMOS transistor MN0 and a drain of an NMOS transistor MN1 are connected to each other and to the input terminal of the slave charge pump module. A source of MN0 is connected to an output terminal of the slave charge pump module to output the programming voltage HV_S. A source of the NMOS transistor MN1 is connected to a drain of MN2, a gate of MN2, and a gate of an NMOS transistor MN3. A gate of MN1 is connected to a gate of MN0 and a source of MN2. A drain and a source of MN3 are connected to each other and to a working clock of the master charge pump module.

BENEFICIAL EFFECTS OF THE PRESENT DISCLOSURE

Beneficial Effects

The present disclosure provides an anti-fuse programming control circuit based on a master-slave charge pump structure. The anti-fuse programming control circuit adopts a structure of combining a master charge pump module and a slave charge pump module. The slave charge pump module follows a connected anti-fuse bank and uses a feedback network for feedback, such that the master charge pump module can adjust the programming voltage of each slave charge pump module in time. This can provide an accurate programming voltage for the anti-fuse bank, which is conducive to improving the consistency of the resistance value after anti-fuse programming and optimizing performance.

In addition, the master charge pump module includes four parallel four-phase master charge pumps that work simultaneously, which ensures the current required for anti-fuse programming is provided. The anti-fuse programming control circuit provides dual working modes and supports programming based on "bit" data. In this case, there is no need for an external high voltage. A high programming voltage is completely provided through conversion by the master charge pump module and the slave charge pump module in the circuit. Programming may alternatively be performed based on "byte" data. In this case, a "transparent transmission" technology of the master charge pump is used to transmit the external high voltage provided by an external pin to an anti-fuse for programming without loss to improve programming efficiency. The dual working modes can be switched flexibly and can be applied to address different programming needs.

DETAILED DESCRIPTION OF THE EMBODIMENTS

Implementations of the Present Disclosure

The specific implementations of the present disclosure will be further described below with reference to the accompanying drawings.

Figure 1:
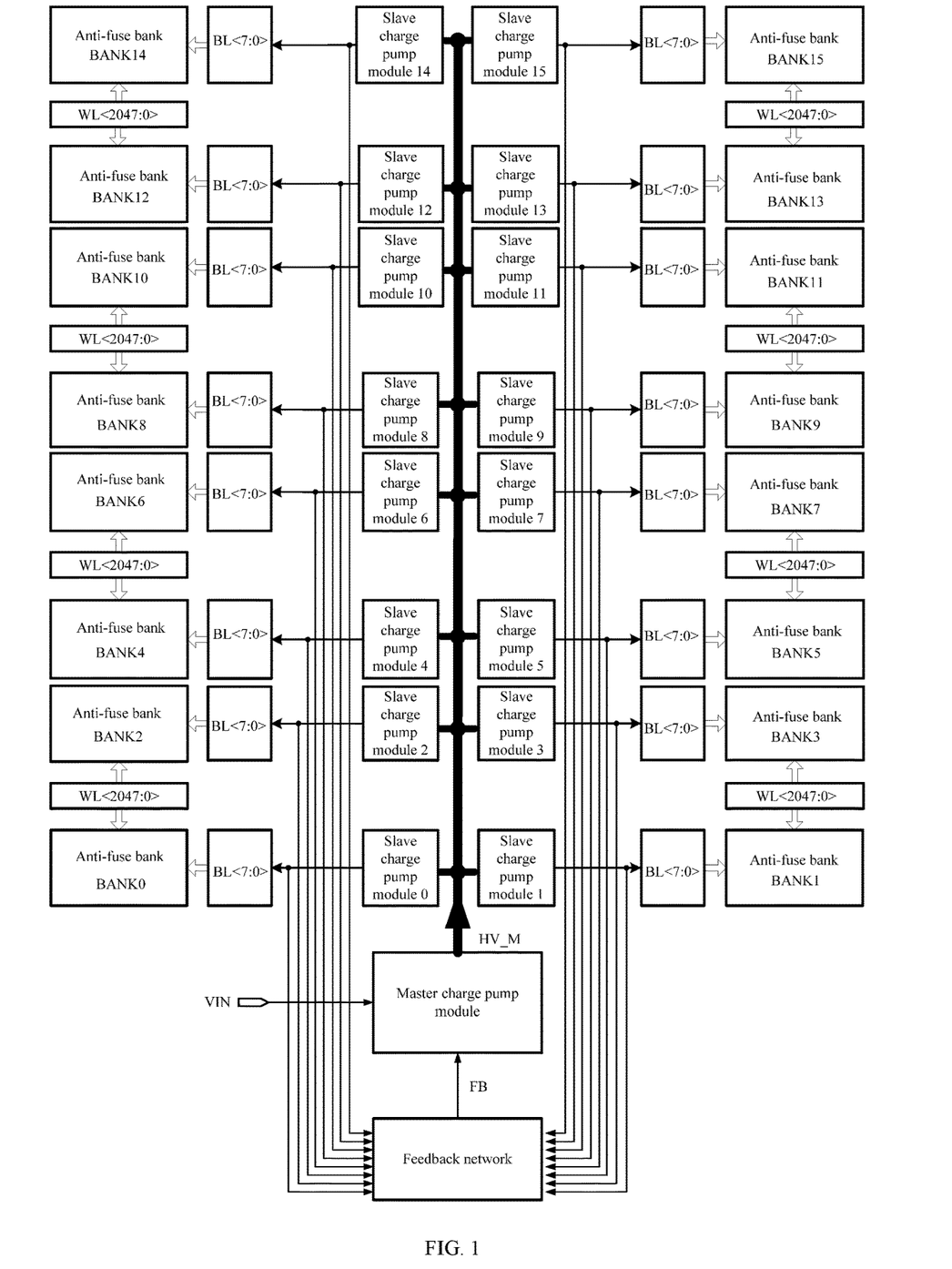
FIG. 1 is a structural diagram of an anti-fuse programming control circuit according to the present disclosure.

The present disclosure provides an anti-fuse programming control circuit based on a master-slave charge pump structure. Referring to FIG. 1, the anti-fuse programming control circuit includes a master charge pump module, a plurality of slave charge pump modules, and a feedback network. The master charge pump module obtains an external voltage VIN and is connected to the slave charge pump modules. Each of the slave charge pump modules is connected to an anti-fuse bank. For example, FIG. 1 shows slave charge pump modules 0 to 15, which are respectively connected to anti-fuse banks 0 to 15. For example, each anti-fuse bank is a 16K bits MTM memory bank, which actually further includes word lines (WLs) and bit lines (BLs). This is not described in detail in the present disclosure.

Based on a programming voltage output by each of the slave charge pump modules to the connected anti-fuse bank, the feedback network outputs a feedback signal FB corresponding to the slave charge pump module to the master charge pump module. Based on the feedback signal corresponding to each of the slave charge pump modules, the master charge pump module adjusts a master drive signal HV_M provided to the slave charge pump module to stabilize the programming voltage output by the slave charge pump module. In an embodiment, the feedback signal FB is used as an enable signal of the master charge pump module. When receiving a feedback signal FB with a valid level and fed back by one slave charge pump module, the master charge pump module is enabled. In this case, the master charge pump module outputs the master drive signal HV_M to the slave charge pump module, and the slave charge pump module works normally and increases the programming voltage. Otherwise, the master charge pump module stops working when receiving a feedback signal FB with an invalid level.

The slave charge pump module in the present disclosure adopts a distributed layout, and the distance between the layout position of each of the slave charge pump modules and the layout position of the connected anti-fuse bank does not exceed a predetermined distance. That is, each of the slave charge pump modules is close to the connected anti-fuse bank, and the working time of each of the slave charge pump modules is synchronized with that of the connected anti-fuse bank. This layout is different from a traditional charge pump layout. This layout can effectively resolve the problem of the large difference between programming voltages of the nearest and farthest anti-fuse banks in the traditional layout, such that all anti-fuse banks can obtain accurate programming voltages.

Figure 2:
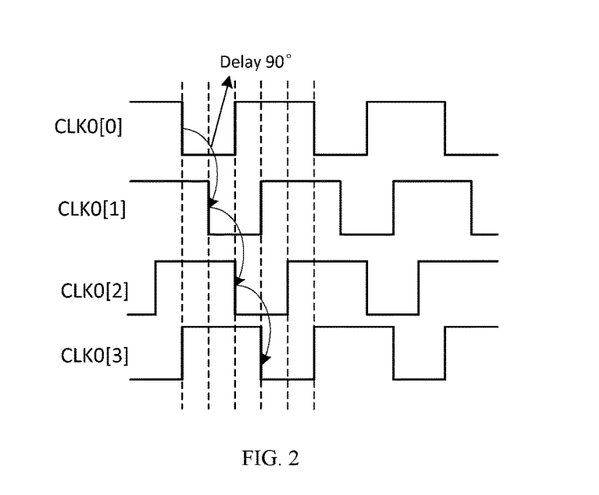
FIG. 2 shows clock phases of working clocks of four master charge pumps in a master charge pump module.

Anti-fuse programming generally requires a relatively large current, usually 8 mA/bit. The master charge pump module needs to provide a master drive signal HV_M of a current value required for anti-fuse programming. In an example, the master charge pump module is implemented by using an existing circuit structure that can provide the master drive signal HV_M of the current value required for anti-fuse programming. Alternatively, in another embodiment, the master charge pump module includes four parallel master charge pumps that work simultaneously. By using the four master charge pumps, the master charge pump module provides the master drive signal HV_M of the current value required for anti-fuse programming. In this embodiment, each of the master charge pumps provides a driving capability of 2 mA@9V. Therefore, the master charge pump module provides a driving capability of 8 mA@9V in total by using the four master charge pumps, which meets the programming requirement of the anti-fuse bank. Working clocks of the four master charge pumps are denoted as CLK0[0], CLK0[1], CLK0[2], and CLK0[3], respectively. The phase difference between the working clocks of the master charge pumps is 90°, such that there is a drive current output in every 360° clock cycle, as shown in FIG. 2.

Figure 3:
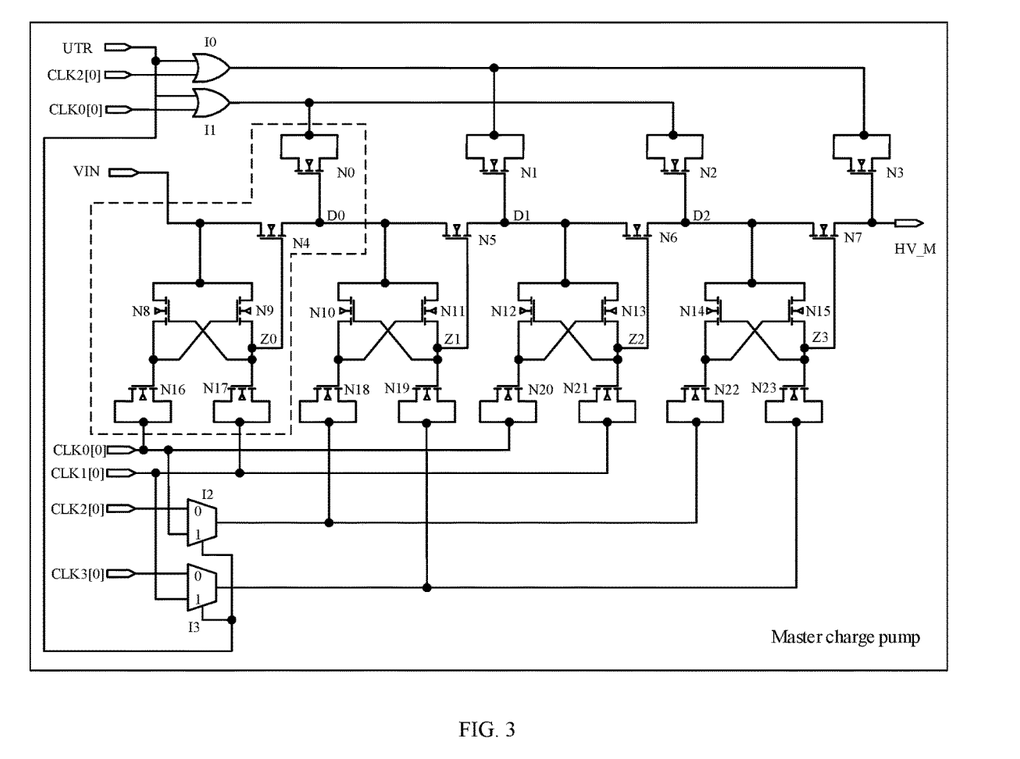
FIG. 3 is a structural circuit diagram of a master charge pump.

Referring to FIG. 3, each of the master charge pumps includes a first voltage conversion module, a second voltage conversion module, a third voltage conversion module, and a fourth voltage conversion module that are cascaded in sequence. An input terminal of the first voltage conversion module is connected to an input terminal of the master charge pump to obtain the external voltage VIN. An output terminal of the fourth voltage conversion module is connected to an output terminal of the master charge pump to output the master drive signal HV_M.

The four voltage conversion modules have the same circuit structure. Taking the first voltage conversion module in the dotted box in FIG. 3 as an example, each voltage conversion module includes NMOS transistors N0, N4, N8, N9, N16, and N17. A drain of N8, a drain of N9, and a drain of N4 are connected and used as the input terminal of the voltage conversion module. A gate of N8, a source of N9, a gate of N17, and a gate of N4 are connected. A gate of N9, a source of N8, and a gate of N16 are connected. A source of N4 and a gate of N0 are connected and used as the output terminal of the voltage conversion module. A drain and a source of N0 are connected and used as a first clock terminal of the voltage conversion module. A drain and a source of N16 are connected and used as a second clock terminal of the voltage conversion module. A drain and a source of N17 are connected and used as a third clock terminal of the voltage conversion module. N8, N9, N16, and N17 form a voltage superimposer. N0 is used for charge storage. The voltage superimposer is intended to increase the voltage at a gate terminal of the NMOS transistor N4 and improve transmission efficiency, where the NMOS transistor N4 forms a charge transmission transistor for transmitting charges. Moreover, in order to improve a driving capability of the charge pump, all the voltage conversion modules in the charge pump are implemented by using NMOS transistors. For the convenience of distinction, other symbols in FIG. 3 are used to represent NMOS transistors in other voltage conversion modules.

The clock terminals of the voltage conversion modules are respectively controlled by clock signals determined by the working clocks of the master charge pumps. The master charge pumps in the present disclosure each have two working modes: a first working mode and a second working mode. The master charge pumps work in the same working mode, such that the whole master charge pump module also works in this working mode. For example, all the master charge pumps work in the first working mode, such that the whole master charge pump module also works in the first working mode. In another example, all the master charge pumps work in the second working mode, such that the whole master charge pump module also works in the second working mode. Each of the master charge pumps works in the first working mode or the second working mode based on a received mode control signal UTR.

(1) When the master charge pump works in the first working mode, the master charge pump obtains a first external voltage, and two adjacent voltage conversion modules are in different working states for voltage conversion and output. The master drive signal output by the master charge pump module when the internal master charge pump works in the first working mode supports bit-based anti-fuse programming. The first external voltage is usually less than the voltage corresponding to the voltage value required for anti-fuse programming. In an example, the first external voltage is 5 V, and the master charge pump increases the first external voltage to 9.5 V for output to meet needs of bit-based anti-fuse programming.

In this case, in each of the master charge pumps, both the first clock terminal of the first voltage conversion module and the first clock terminal of the third voltage conversion module are connected to the working clock CLK0 of the master charge pump. Both the second clock terminal of the first voltage conversion module and the second clock terminal of the third voltage conversion module are connected to the working clock CLK0 of the master charge pump. Both the third clock terminal of the first voltage conversion module and the third clock terminal of the third voltage conversion module are connected to a first clock signal CLK1 of the master charge pump.

Both the first clock terminal of the second voltage conversion module and the first clock terminal of the fourth voltage conversion module are connected to a second clock signal CLK2 of the master charge pump. Both the second clock terminal of the second voltage conversion module and the second clock terminal of the fourth voltage conversion module are connected to the second clock signal CLK2 of the master charge pump. Both the third clock terminal of the second voltage conversion module and the third clock terminal of the fourth voltage conversion module are connected to a third clock signal CLK3 of the master charge pump.

Figure 4:
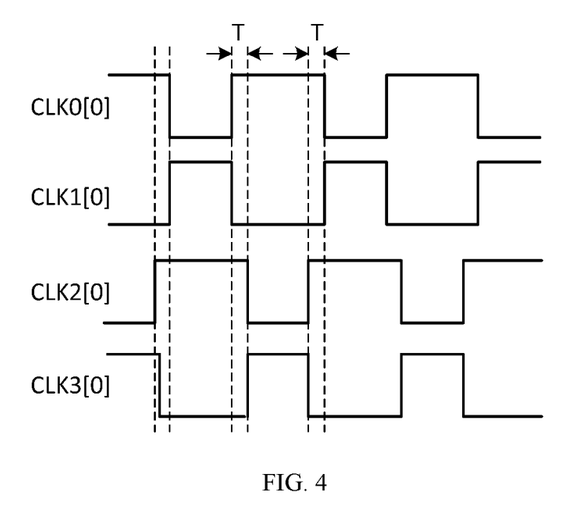
FIG. 4 shows clock phases of clock signals in a master charge pump.

CLK1, CLK2, and clk3 are all determined by the working clock CLK0. As shown in FIG. 4, the first clock signal CLK1 and the working clock CLK0 are a pair of overlapping clocks. The second clock signal CLK2 and the third clock signal CLK3 are a pair of overlapping clocks. The second clock signal CLK2 and the working clock CLK0 are a pair of inverse clocks. FIG. 3 and FIG. 4 show an example in which the working clock of the master charge pump is CLK0[0] in FIG. 2. Therefore, CLK0 to CLK3 in the charge pump are specifically denoted as CLK0[0], CLK1[0], CLK2 [0], and CLK3 [0], respectively. For the master charge pump whose working clock is CLK0[1] in FIG. 2, CLK0 to CLK3 in the charge pump are correspondingly denoted as CLK0 [1], CLK1[1], CLK2[1], and CLK3[1], respectively, and so on.

Further, as shown in FIG. 4, the second clock signal CLK2 and the working clock CLK0 in one charge pump are a pair of non-overlapping inverse clocks, and both CLK0 and CLK2 are simultaneously at a high level in a predetermined duration T at rising and falling edges, which reduces the charge loss and improves the transmission efficiency of each level of the voltage conversion module.

(2) When the master charge pump works in the second working mode, all the voltage conversion modules are in the same working state. The master charge pump directly and transparently transmits and outputs an obtained second external voltage, and the master drive signal output by the master charge pump module when the internal master charge pump works in the second working mode supports byte-based anti-fuse programming. The second external voltage is greater than the first external voltage, and the second external voltage is usually equal to the voltage corresponding to the voltage value required for anti-fuse programming. In this case, based on the structure shown in FIG. 3, voltage superimposers in the four levels of voltage conversion modules are in the same working state, and the gate voltages of the NMOS transistors N4, N5, N6, and N7 in the four voltage conversion modules are the same, namely, a voltage obtained after a high-level voltage of the clock signal is superimposed on the second external voltage, where the NMOS transistors N4, N5, N6, and N7 all form charge transmission transistors for transmitting charges. In this way, there is no threshold voltage loss when the second external voltage is transmitted, which is referred to as transparent transmission. In an example, the second external voltage is 9.5 V, and the high-level voltage of the clock signal is 3.3 V. Therefore, the gate voltages of N4, N5, N6, and N7 are all 12.8 V. There is no threshold voltage loss when the second external voltage of 9.5 V is transmitted, and the second external voltage externally input is transparently transmitted to the slave charge pump module, which makes up for the defect that an on-chip charge pump cannot realize a current of the magnitude of dozens of mA, meets the byte-based programming function of the anti-fuse bank, and improves programming efficiency.

Specifically, referring to FIG. 3, each of the master charge pumps further includes OR gates I0 and I1 and dual-input selectors I2 and I3. One input terminal of I0 is connected to the mode control signal UTR, the other input terminal of I0 is connected to the second clock signal CLK2, and an output terminal of I0 is connected to the first clock terminal of the second voltage conversion module and the first clock terminal of the fourth voltage conversion module. One input terminal of I1 is connected to the mode control signal UTR, the other input terminal of I1 is connected to the working clock CLK0, and an output terminal of I1 is connected to the first clock terminal of the first voltage conversion module and the first clock terminal of the third voltage conversion module.

The second clock terminal of the first voltage conversion module and the second clock terminal of the third voltage conversion module are connected to the working clock CLK0, and the third clock terminal of the first voltage conversion module and the third clock terminal of the third voltage conversion module are connected to the first clock signal CLK1.

A first input terminal of I2 is connected to the second clock signal CLK2, a second input terminal of I2 is connected to the working clock CLK0, an output terminal of I2 is connected to the second clock terminal of the second voltage conversion module and the second clock terminal of the fourth voltage conversion module, and a selection input terminal of I2 is connected to the mode control signal UTR.

A first input terminal of I3 is connected to the third clock signal CLK3, a second input terminal of I3 is connected to the first clock signal CLK1, an output terminal of I3 is connected to the third clock terminal of the second voltage conversion module and the third clock terminal of the fourth voltage conversion module, and a selection input terminal of I3 is connected to the mode control signal UTR.

When the mode control signal UTR is 0, I2 outputs the second clock signal CLK2, I3 outputs the third clock signal CLK3, I0 outputs CLK2, and I1 outputs CLK0. In this case, the master charge pump enters the first working mode.

When the mode control signal UTR is 1, I0 and I1 always output 1, and N0, N1, N2, and N3 used for charge storage in the four voltage conversion modules no longer need a bootstrap voltage. I2 outputs the working clock CLK0, and I3 outputs the first clock signal CLK1. In this way, the four voltage conversion modules are in the same working state, and the master charge pump enters the second working mode.

Figure 5:
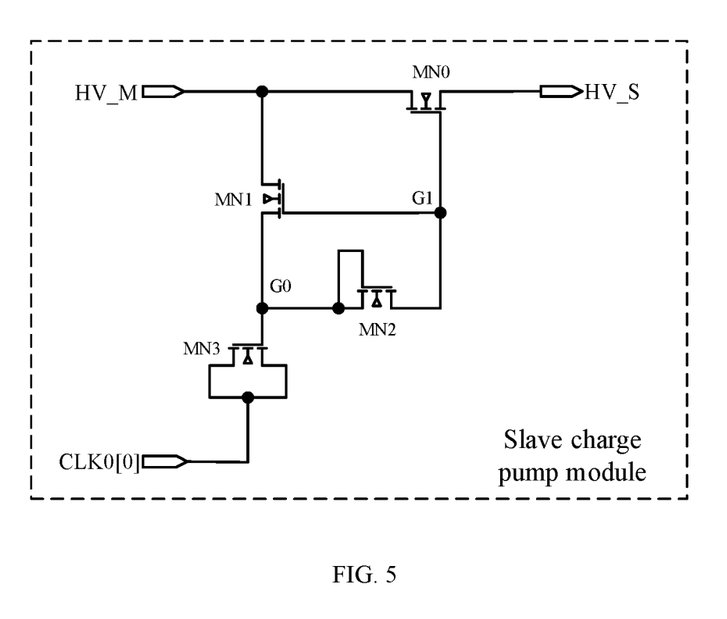
FIG. 5 is a structural circuit diagram of a slave charge pump module.

Referring to FIG. 5, an input terminal of each of the slave charge pump modules is connected to an output terminal of the master charge pump module and obtains the master drive signal HV_M output by the master charge pump module. A drain of an NMOS transistor MN0 and a drain of an NMOS transistor MN1 are connected to each other and to the input terminal of the slave charge pump module. A source of MN0 is connected to an output terminal of the slave charge pump module to output the programming voltage HV_S. A source of the NMOS transistor MN1 is connected to a drain of MN2, a gate of MN2, and a gate of an NMOS transistor MN3. A gate of MN1 is connected to a gate of MN0 and a source of MN2. A drain and a source of MN3 are connected to each other and to a working clock of the master charge pump module. The working clock of the master charge pump module herein is the working clock of any master charge pump in the master charge pump module, in other words, may be any one of CLK0[0], CLK0[1], CLK0[2], and CLK0[3] in FIG. 2. FIG. 5 shows an example in which CLK0[0] is connected.

Figure 6:
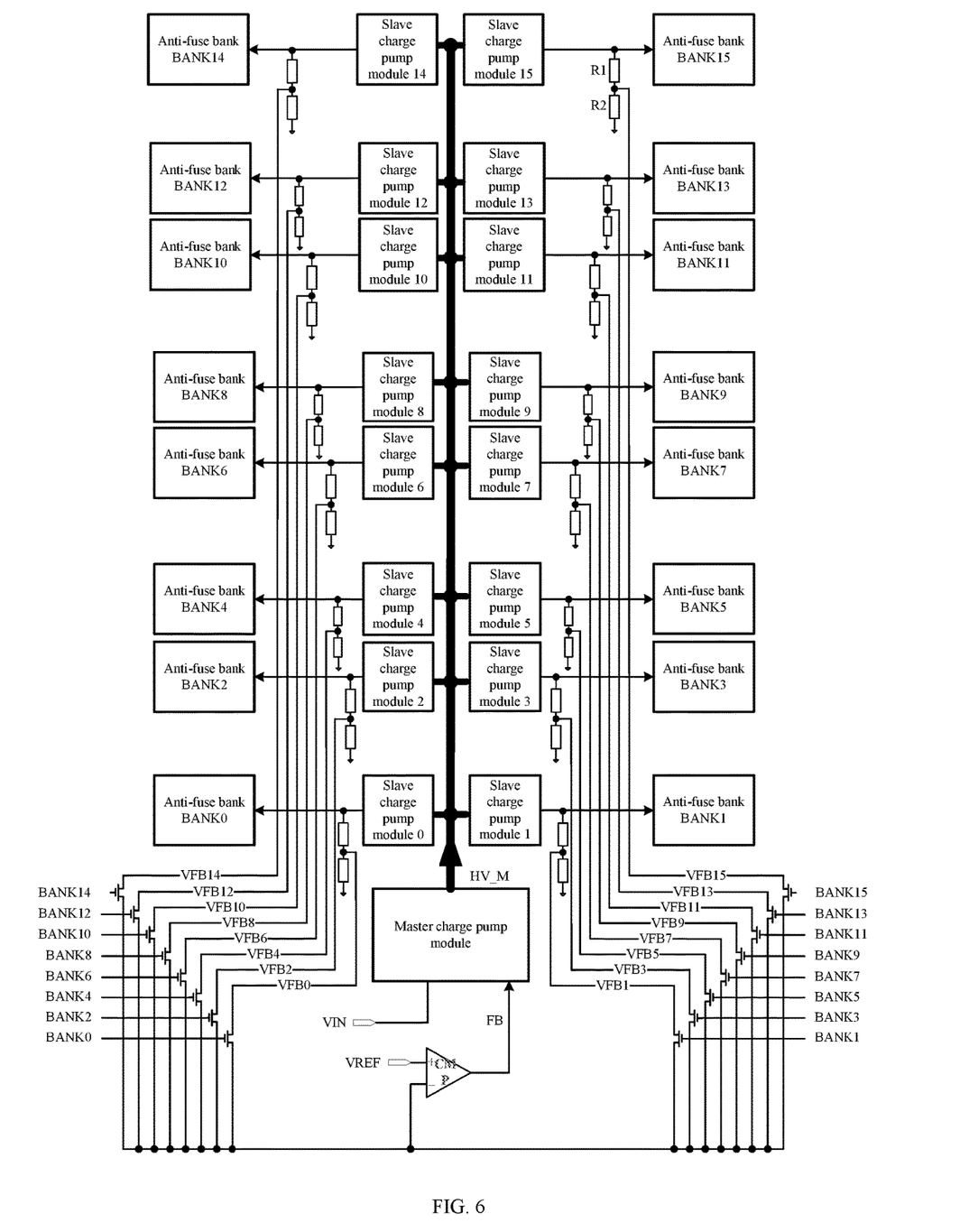
FIG. 6 is a structural diagram of a feedback network according to an embodiment.

In contrast to FIG. 1, FIG. 6 omits word lines and bit lines. The feedback network includes a feedback voltage selection module, a comparator CMP, and voltage dividing modules respectively connected at output terminals of the slave charge pump modules. The voltage dividing modules each include series resistors R1 and R2. One end of the series circuit is connected to the output terminal of the slave charge pump module and the other end is grounded. The common end of R1 and R2 outputs voltage dividing signals VFB1 to VFB15 of a programming voltage of one connected slave charge pump module.

The feedback voltage selection module includes a plurality of input terminals and an output terminal. The input terminals of the feedback voltage selection module are respectively connected to the voltage dividing modules to obtain the voltage dividing signals VFB1 to VFB15. The output terminal of the feedback voltage selection module is connected to an inverting input terminal of the comparator CMP, and a noninverting input terminal of the comparator is connected to a reference voltage. The feedback voltage selection module selects and outputs a voltage dividing signal of a programming voltage of one slave charge pump module to the comparator. Specifically, the feedback voltage selection module includes a plurality of selection switch transistors. Each of the selection switch transistors is connected between one voltage dividing module and the output terminal of the feedback voltage selection module, and the selection switch transistors are controlled by selection signals of anti-fuse banks 0 to 15 connected to the slave charge pump modules connected to the voltage dividing modules, where the selection signals are provided by an address decoder. For example, a switch transistor of a voltage dividing module connected to slave charge pump module 3 obtains the voltage dividing signal VFB3, and the switch transistor is controlled by the selection signal of anti-fuse bank 3.

An output terminal of the comparator CMP outputs a feedback signal FB of one selected slave charge pump module to the master charge pump module as an enable signal of the master charge pump module, and the master charge pump module is enabled at a high level. In the structure shown in FIG. 6, when the feedback voltage selection module selects one of the slave charge pump modules and outputs a voltage dividing signal corresponding to the slave charge pump module to the comparator and the output voltage dividing signal is lower than the reference voltage VREF, the comparator outputs a high-level feedback signal FB to enable the master charge pump module, and the master charge pump module starts to work. This increases the programming voltage HV_S output by the selected slave charge pump module to realize a stabilization function. Otherwise, the comparator outputs a low-level feedback signal FB.

The above merely describes preferred implementations of the present disclosure, and the present disclosure is not limited to the above embodiments. It is understood that improvements and modifications directly derived from or associated with the present disclosure by those skilled in the art do not depart from the spirit and concept of the present disclosure and should be regarded as being within the protection scope of the present disclosure.

What is claimed is:

1. An anti-fuse programming control circuit based on a master-slave charge pump structure, wherein the anti-fuse programming control circuit comprises a master charge pump module, a plurality of slave charge pump modules, and a feedback network, wherein the master charge pump module obtains an external voltage and is connected to the plurality of slave charge pump modules, each of the slave charge pump modules is connected to an anti-fuse bank, and a distance between a layout position of each of the slave charge pump modules and a layout position of the anti-fuse bank does not exceed a predetermined distance; and     based on a programming voltage output by each of the slave charge pump modules to the anti-fuse bank, the feedback network outputs a feedback signal corresponding to the slave charge pump module to the master charge pump module; and based on the feedback signal corresponding to each of the slave charge pump modules, the master charge pump module adjusts a master drive signal provided to the slave charge pump module to stabilize the programming voltage output by the slave charge pump module,     wherein the master charge pump module comprises four parallel master charge pumps, wherein the four parallel master charge pumps work simultaneously, wherein a phase difference between working clocks of the four parallel master charge pumps is 90°; and by using the four parallel master charge pumps, the master charge pump module provides the master drive signal of a current value required for anti-fuse programming.

2. The anti-fuse programming control circuit according to claim 1, wherein each master charge pump of the four parallel master charge pumps comprises a first voltage conversion module, a second voltage conversion module, a third voltage conversion module, and a fourth voltage conversion module, wherein the first voltage conversion module, the second voltage conversion module, the third voltage conversion module, and the fourth voltage conversion module are cascaded in sequence, wherein an input terminal of the first voltage conversion module is connected to an input terminal of the master charge pump to obtain the external voltage, and an output terminal of the fourth voltage conversion module is connected to an output terminal of the master charge pump to output the master drive signal;

each voltage conversion module of the first voltage conversion module, the second voltage conversion module, the third voltage conversion module and the fourth voltage conversion module comprises a negative channel metal oxide semiconductor (NMOS) transistor N0, an NMOS transistor N4, an NMOS transistor N8, an NMOS transistor N9, an NMOS transistor N16, and an NMOS transistor N17, wherein a drain of the NMOS transistor N8, a drain of the NMOS transistor N9, and a drain of the NMOS transistor N4 are connected and used as the input terminal of the voltage conversion module; a gate of the NMOS transistor N8, a source of the NMOS transistor N9, a gate of the NMOS transistor N17, and a gate of the NMOS transistor N4 are connected; a gate of the NMOS transistor N9, a source of the NMOS transistor N8, and a gate of the NMOS transistor N16 are connected; a source of the NMOS transistor N4 and a gate of the NMOS transistor N0 are connected and used as the output terminal of the voltage conversion module; a drain and a source of the NMOS transistor N0 are connected and used as a first clock terminal of the voltage conversion module; a drain and a source of the NMOS transistor N16 are connected and used as a second clock terminal of the voltage conversion module; and a drain and a source of the NMOS transistor N17 are connected and used as a third clock terminal of the voltage conversion module; and     the clock terminals of the first voltage conversion module, the second voltage conversion module, the third voltage conversion module and the fourth voltage conversion module are respectively controlled by clock signals determined by the working clocks of the four parallel master charge pumps.

3. The anti-fuse programming control circuit according to claim 2, wherein each master charge pump of the four parallel master charge pumps works in a first working mode or a second working mode based on a received mode control signal;

when the master charge pump works in the first working mode, the master charge pump obtains a first external voltage, two adjacent voltage conversion modules are in different working states for voltage conversion and output, and the master drive signal output by the master charge pump module when the internal master charge pump works in the first working mode supports bit-based anti-fuse programming; and     when the master charge pump works in the second working mode, the first voltage conversion module, the second voltage conversion module, the third voltage conversion module and the fourth voltage conversion module are in a same working state, the master charge pump directly and transparently transmits and outputs an obtained second external voltage, and the master drive signal output by the master charge pump module when the internal master charge pump works in the second working mode supports byte-based anti-fuse programming, wherein the second external voltage is greater than the first external voltage.

4. The anti-fuse programming control circuit according to claim 3, wherein when the master charge pump works in the first working mode, in the master charge pump:

the first clock terminal of the first voltage conversion module and the first clock terminal of the third voltage conversion module are connected to the working clock CLK0 of the master charge pump; the second clock terminal of the first voltage conversion module and the second clock terminal of the third voltage conversion module are connected to the working clock CLK0 of the master charge pump; and the third clock terminal of the first voltage conversion module and the third clock terminal of the third voltage conversion module are connected to a first clock signal CLK1 of the master charge pump;

the first clock terminal of the second voltage conversion module and the first clock terminal of the fourth voltage conversion module are connected to a second clock signal CLK2 of the master charge pump; the second clock terminal of the second voltage conversion module and the second clock terminal of the fourth voltage conversion module are connected to the second clock signal CLK2 of the master charge pump; and the third clock terminal of the second voltage conversion module and the third clock terminal of the fourth voltage conversion module are connected to a third clock signal CLK3 of the master charge pump; and     the first clock signal CLK1 and the working clock CLK0 are a first pair of overlapping clocks, the second clock signal CLK2 and the third clock signal CLK3 are a second pair of overlapping clocks, and the second clock signal CLK2 and the working clock CLK0 are a pair of inverse clocks.

5. The anti-fuse programming control circuit according to claim 4, wherein the second clock signal CLK2 and the working clock CLK0 are a pair of non-overlapping inverse clocks, and the working clock CLK0 and the second clock signal CLK2 are simultaneously at a high level in a predetermined duration at rising and falling edges.

6. The anti-fuse programming control circuit according to claim 4, wherein the master charge pump further comprises an OR gate I0, an OR gate I1, a dual-input selector I2 and a dual-input selector I3, wherein
a first input terminal of the OR gate I0 is connected to the mode control signal UTR, a second input terminal of the OR gate I0 is connected to the second clock signal CLK2, and an output terminal of the OR gate I0 is connected to the first clock terminal of the second voltage conversion module and the first clock terminal of the fourth voltage conversion module;
a first input terminal of the OR gate I1 is connected to the mode control signal UTR, a second input terminal of the OR gate I1 is connected to the working clock CLK0, and an output terminal of the OR gate I1 is connected to the first clock terminal of the first voltage conversion module and the first clock terminal of the third voltage conversion module;
the second clock terminal of the first voltage conversion module and the second clock terminal of the third voltage conversion module are connected to the working clock CLK0, and the third clock terminal of the first voltage conversion module and the third clock terminal of the third voltage conversion module are connected to the first clock signal CLK1;
a first input terminal of the dual-input selector I2 is connected to the second clock signal CLK2, a second input terminal of the dual-input selector I2 is connected to the working clock CLK0, an output terminal of the dual-input selector I2 is connected to the second clock terminal of the second voltage conversion module and the second clock terminal of the fourth voltage conversion module, and a selection input terminal of the dual-input selector I2 is connected to the mode control signal UTR;
a first input terminal of the dual-input selector I3 is connected to the third clock signal CLK3, a second input terminal of the dual-input selector I3 is connected to the first clock signal CLK1, an output terminal of the dual-input selector I3 is connected to the third clock terminal of the second voltage conversion module and the third clock terminal of the fourth voltage conversion module, and a selection input terminal of the dual-input selector I3 is connected to the mode control signal UTR;
when the mode control signal UTR is 0, the dual-input selector I2 outputs the second clock signal CLK2, the dual-input selector I3 outputs the third clock signal CLK3, and the master charge pump enters the first working mode; and
when the mode control signal UTR is 1, the dual-input selector I2 outputs the working clock CLK0, the dual-input selector I3 outputs the first clock signal CLK1, and the master charge pump enters the second working mode.

7. The anti-fuse programming control circuit according to claim 1, wherein the feedback network comprises a feedback voltage selection module, a comparator, and voltage dividing modules, wherein the voltage dividing modules are respectively connected at output terminals of the slave charge pump modules, wherein each of the voltage dividing modules outputs a voltage dividing signal of a programming voltage of one slave charge pump module connected to each of the voltage dividing modules;
the feedback voltage selection module comprises a plurality of input terminals and an output terminal, wherein the input terminals of the feedback voltage selection module are respectively connected to the voltage dividing modules to obtain voltage dividing signals, the output terminal of the feedback voltage selection module is connected to an inverting input terminal of the comparator, and a noninverting input terminal of the comparator is connected to a reference voltage; and
the feedback voltage selection module selects and outputs a voltage dividing signal of a programming voltage of one slave charge pump module to the comparator, an output terminal of the comparator outputs a feedback signal of one selected slave charge pump module to the master charge pump module as an enable signal of the master charge pump module, and the master charge pump module is enabled at a high level.

8. An anti-fuse programming control circuit based on a master-slave charge pump structure, wherein the anti-fuse programming control circuit comprises a master charge pump module, a plurality of slave charge pump modules, and a feedback network, wherein the master charge pump module obtains an external voltage and is connected to the plurality of slave charge pump modules, each of the slave charge pump modules is connected to an anti-fuse bank, and a distance between a layout position of each of the slave charge pump modules and a layout position of the anti-fuse bank does not exceed a predetermined distance; and
based on a programming voltage output by each of the slave charge pump modules to the anti-fuse bank, the feedback network outputs a feedback signal corresponding to the slave charge pump module to the master charge pump module; and based on the feedback signal corresponding to each of the slave charge pump modules, the master charge pump module adjusts a master drive signal provided to the slave charge pump module to stabilize the programming voltage output by the slave charge pump module,
wherein the feedback network comprises a feedback voltage selection module, a comparator, and voltage dividing modules, wherein the voltage dividing modules are respectively connected at output terminals of the slave charge pump modules, wherein each of the voltage dividing modules outputs a voltage dividing signal of a programming voltage of one slave charge pump module connected to each of the voltage dividing modules,
wherein the feedback voltage selection module comprises a plurality of input terminals and an output terminal, wherein the input terminals of the feedback voltage selection module are respectively connected to the voltage dividing modules to obtain voltage dividing signals, the output terminal of the feedback voltage selection module is connected to an inverting input terminal of the comparator, and a noninverting input terminal of the comparator is connected to a reference voltage,
wherein the feedback voltage selection module selects and outputs a voltage dividing signal of a programming voltage of one slave charge pump module to the comparator, an output terminal of the comparator outputs a feedback signal of one selected slave charge pump module to the master charge pump module as an enable signal of the master charge pump module, and the master charge pump module is enabled at a high level, and wherein the feedback voltage selection module comprises a plurality of selection switch transistors, wherein each of the selection switch transistors is connected between one voltage dividing module and the output terminal of the feedback voltage selection module, and the selection switch transistor is controlled by a selection signal of the anti-fuse bank, wherein the anti-fuse bank is connected to the slave charge pump module, wherein the slave charge pump module is connected to the voltage dividing module.

9. The anti-fuse programming control circuit according to claim 1, wherein an input terminal of each of the slave charge pump modules is connected to an output terminal of the master charge pump module and obtains the master drive signal HV_M output by the master charge pump module; a drain of an NMOS transistor MN0 and a drain of an NMOS transistor MN1 are connected to each other and to the input terminal of the slave charge pump module; a source of the NMOS transistor MN0 is connected to an output terminal of the slave charge pump module to output the programming voltage HV_S; a source of the NMOS transistor MN1 is connected to a drain of an NMOS transistor MN2, a gate of the NMOS transistor MN2, and a gate of an NMOS transistor MN3; a gate of the NMOS transistor MN1 is connected to a gate of the NMOS transistor MN0 and a source of the NMOS transistor MN2; and a drain and a source of the NMOS transistor MN3 are connected to each other and to a working clock of the master charge pump module.

* * * * *